(12) United States Patent
Hoss et al.

(10) Patent No.: US 6,279,754 B1
(45) Date of Patent: Aug. 28, 2001

(54) METHOD AND APPARATUS FOR RELEASABLY SECURING A COMPUTER SYSTEM COMPONENT WITHIN A HOUSING

(75) Inventors: Shawn P. Hoss, Round Rock; Timothy C. Dearborn, Austin, both of TX (US)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 09/302,900

(22) Filed: Apr. 30, 1999

(51) Int. Cl.[7] ...................................................... A47F 5/00
(52) U.S. Cl. ............................ 211/26; 211/182; 211/189; 312/265.4; 312/223.2; 361/829; 411/46; 411/48; 411/15; 411/349
(58) Field of Search ............................... 211/26, 189, 182; 312/265.4, 265.1, 223.2; 361/829, 683, 685, 732, 810; 411/41, 46, 48, 57.1, 15, 349

(56) References Cited

U.S. PATENT DOCUMENTS

| | | | |
|---|---|---|---|
| 3,964,364 | * | 6/1976 | Poe . |
| 4,007,516 | * | 2/1977 | Coules . |
| 5,261,772 | * | 11/1993 | Henninger et al. ............. 411/46 |
| 5,267,762 | | 12/1993 | Gromotka ........................ 292/229 |
| 5,312,005 | * | 5/1994 | Odell ............................ 211/26 X |
| 5,450,285 | * | 9/1995 | Schlemmer ................... 361/683 X |
| 5,460,441 | * | 10/1995 | Hastings et al. ............. 361/683 X |
| 5,567,098 | * | 10/1996 | Gordon ............................. 411/48 |
| 5,609,373 | | 3/1997 | Gromotka ........................ 292/229 |
| 5,622,064 | * | 4/1997 | Gluskoter et al. ................ 70/14 |
| 5,664,813 | | 9/1997 | Gromotka ........................ 292/229 |
| 5,743,606 | | 4/1998 | Scholder ......................... 312/223.2 |
| 5,775,860 | * | 7/1998 | Meyer ............................. 411/46 |
| 5,791,498 | * | 8/1998 | Mills .............................. 211/26 |
| 5,896,273 | * | 4/1999 | Varghese et al. ............. 361/683 X |
| 5,992,808 | * | 11/1999 | Morrow ........................... 211/26 X |
| 6,038,892 | * | 3/2000 | Schmitt ............................ 70/78 |
| 6,053,586 | * | 4/2000 | Cook et al. ..................... 3120/223.2 |

OTHER PUBLICATIONS

"EIA Standard: Cabinets, Racks, Panels, and Associated Equipment", Electronic Industries Association (Engineering Department): EIA–310–D; pp. 1–18, Sep. 1992.

* cited by examiner

Primary Examiner—Robert W. Gibson, Jr.
(74) Attorney, Agent, or Firm—Baker Botts L.L.P.

(57) ABSTRACT

A releasable latching apparatus and method of operation for securing a component of a computer system to a computer housing. The latching apparatus includes a casing and a shaft integrated with the casing such that the shaft is operable to move relative to the casing. Incorporated into the latching apparatus is a collet that extends along the shaft. The collet includes a locking portion, which can releasably secure a computer component to a housing by extending away from the shaft and capturing an element of the computer housing.

32 Claims, 4 Drawing Sheets

METHOD AND APPARATUS FOR RELEASABLY SECURING A COMPUTER SYSTEM COMPONENT WITHIN A HOUSING

TECHNICAL FIELD OF THE INVENTION

This invention relates in general to the field of electronic equipment enclosures and, more particularly, to a method and apparatus for releasably securing a computer system component within a housing.

BACKGROUND OF THE INVENTION

Computer systems are becoming increasingly complex. It is not unusual for a single computer system to include a combination of several computer components. Though the components may include diverse types of equipment (e.g., telephonic equipment or computing equipment), system users usually prefer that the system be housed in a common enclosure. This preference influenced the development of rack storage devices (Racks). Racks are standard in the computer industry and allow components to be placed within them in a modular fashion such that various combinations of components can be integrated into a single system.

A number of vendors sell standard EIA (Electronics Industries Association) racks, which comply with EIA specifications including size limitations. Many of these racks employ a fairly simple slide device for securing the system components within the rack. The slide device extends from the rack cabinet to facilitate the accessing of the component and retracts into the cabinet to allow for the in-place securing of the component. The slide device is not, however, essential.

Whether a rack employs the slide device or some other component mounting device, the component, itself, must be connected to the rack in a secure manner. Conventionally, this secure connection is provided with a series of male and female threaded devices. In these conventional systems, the threaded devices connect the component, or some part of it, to the housing. Additional threaded devices may also be used to mount pull handles onto the component. These pull handles allow the component to be pulled from the rack once the component is no longer secured in place.

There are several disadvantages associated with the conventional approach's reliance on threaded devices. For example, the conventional system requires the use of a significant number of parts at each secure connection point (e.g., a bolt, a washer and a nut). This in turn creates at least two complications. First, the conventional system creates alignment issues (i.e., the nut, which is secured to the rack cabinet and is intended to receive the bolt, must be correctly located relative to the bolt). And second, the combination of numerous parts and manufacturing challenges (e.g., alignment problems), necessarily increases manufacturing costs.

An additional problem arises when a user seeks to un-secure and/or re-secure a component within the rack. The un-secure/re-secure procedure is unduly time consuming and complicated as a result of the many threaded parts. Frequently, a component will be secured in place at four or more connection points. As a result, the user must unthread at least four bolts from their associated receiving nuts and keep track of these four bolts while the component is in an unsecured state.

SUMMARY OF THE INVENTION

In accordance with teachings of the present invention, a method and apparatus for releasably securing a computer system component within a housing are disclosed that provide significant advantages over prior technologies.

According to one aspect of the present invention a releasable latching apparatus for securing a component of a computer system to a computer housing is disclosed. One embodiment of the apparatus includes a casing and a shaft integrated with the casing such that the shaft is operable to move relative to the casing. This movement could be rotational. It could also be, among other alternatives, linear along the shaft. Coupled to the shaft is an actuator, which could include a handle. It could also include a keyed mechanism for key actuation. Incorporated into the latching apparatus is a collet that extends along the shaft. The collet includes a locking portion, which can releasably secure a computer component to a housing by extending away from the shaft and capturing an element of the computer housing. In one embodiment, the collet includes a projecting finger, and the captured element of the computer housing includes a hole that extends through an EIA rail, which is secured to the rack housing. In another embodiment, the collet includes a spring finger that is operable to flex and extend away from the shaft. A variety of mechanisms can be used to cause the collet to extend away from the shaft. For example, the shaft could include a tapered end with a varying cross sectional area. As the shaft is moved and a portion of the shaft having a larger cross sectional area is brought into contact with an inner surface of the collet, the collet will extend outward and capture an element of the computer housing. In another embodiment, the shaft could include a cam having at least one lobe. As the shaft is rotated, the cam lobe is brought into contact with the inner surface of the collet and forces the collet to extend outward and capture an element of the computer housing.

A technical advantage of the present invention is a reduction in the number of total parts and, resultantly, a reduction in manufacturing time and cost. The above described apparatus could be a single part that directly couples to a component face plate. This coupling could be accomplished in a number of ways (e.g., a locking clip attached to the apparatus on the back side of the face plate). Moreover, the apparatus could include a handle coupled to the actuator. Because the apparatus is securely attached to the component, this coupled handle eliminates the need for additional pull handles, which are necessary in conventional systems.

Another technical advantage of the present invention is ease of alignment. For example, one embodiment of the apparatus is operable to engage and capture a hole in an EIA rail, which is fixed to the housing. A typical EIA rail has holes displaced incrementally along its length. As such, there is no requirement for the accurate placing of a specific receiving device.

Additionally, the latching apparatus of the present invention could be manufactured to have quarter turn actuation. A latching apparatus that is securely attached, for example, to the face plate of a component and operates with quarter turn actuation would greatly reduce the effort required to un-secure and/or re-secure a component within the rack.

Other technical advantages should be apparent to one of skill in the art from the following description, drawings and claims.

BRIEF DESCRIPTION OF THE DRAWINGS

A more complete understanding of the present invention and advantages thereof may be acquired by referring to the following description taken in conjunction with the accompanying drawings, in which like reference numbers indicate like features, and wherein.

DETAILED DESCRIPTION OF THE INVENTION

Preferred embodiments of the present invention and its advantages are best understood by reference to FIGS. 1 through 5, wherein like numbers are used to indicate like and corresponding parts.

Figure 1:
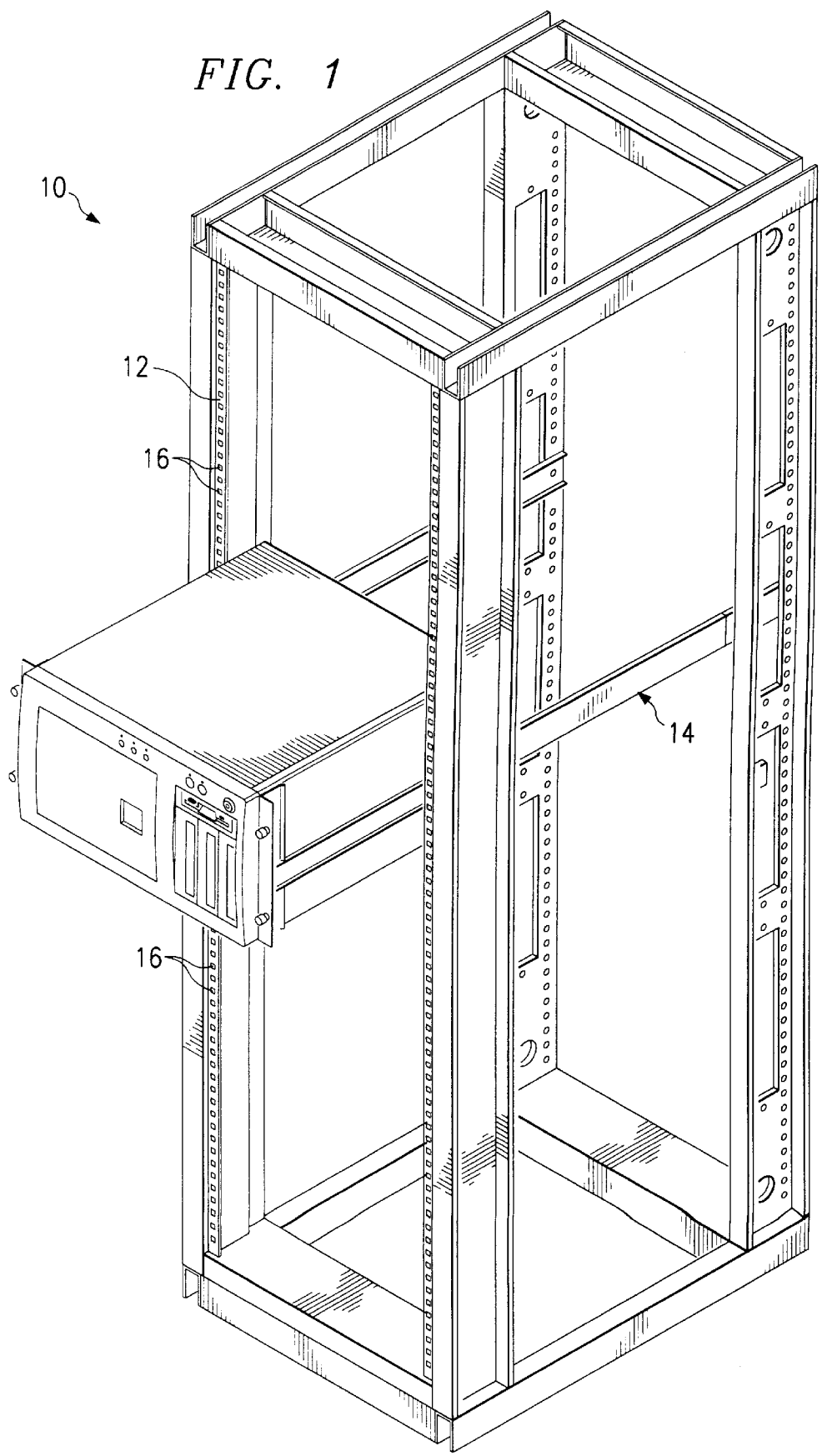
FIG. 1 depicts a rack cabinet frame with an attached EIA rail with which an apparatus incorporating teachings of the present invention could engage.

FIG. 1 depicts a rack cabinet frame, identified generally at 10, with an attached EIA rail 12 with which an apparatus incorporating teachings of the present invention could engage. EIA rail 12 runs the vertical length of rack cabinet frame 10. A number of holes, depicted at 16, extend through EIA rail 12. Rack cabinet frame 10 also includes a slide mechanism 14. Slide mechanism 14 is operable to support various computer components. Rack cabinet frame 10 as well as EIA rail 12 are designed and dimensioned in accordance with EIA standard EIA-310-D, the Electronic Industries Association's standard for Cabinets, Racks, Panels, and Associated Equipment.

Figure 2:
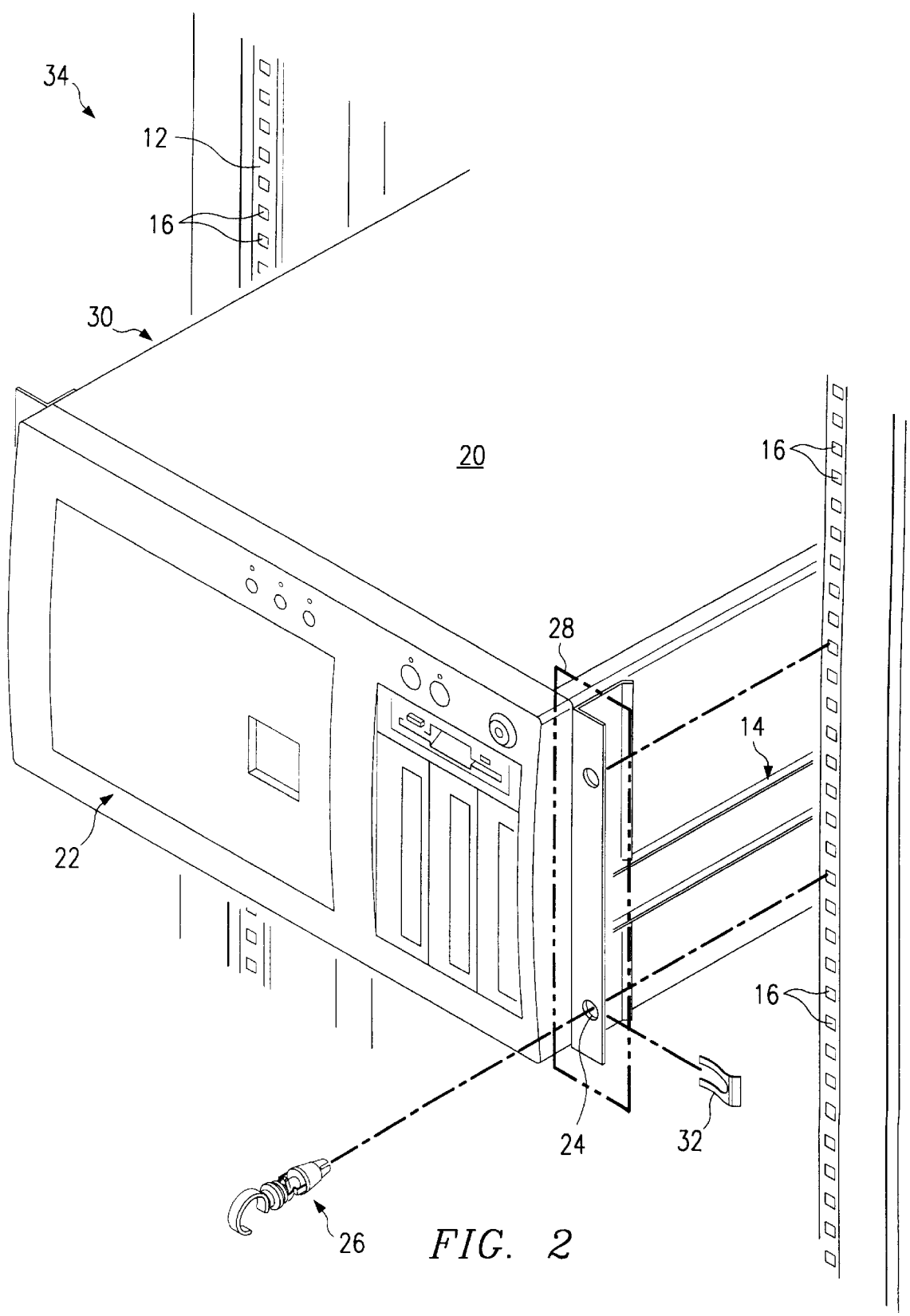
FIG. 2 depicts a computer component having a face plate, which can provide an attachment point for an apparatus incorporating teachings of the present invention.

FIG. 2 depicts an embodiment of the present invention, representatively depicted at 26 and a computer component, indicated generally at 20, having a face plate 22. Face plate 22 has an associated flange 28, which extends beyond the side wall 30 of component 20 and provides a location for an attachment point 24. Attachment point 24 represents a point at which embodiment 26 could be securely attached to associated flange 28. In another embodiment, attachment point 24 could be located on a face plate (e.g., a face plate that extended beyond side wall 30 without the addition of a flange). Though represented as a round hole, attachment point 24 could have other shapes (e.g., a slotted hole). One method of securing embodiment 26 at attachment point 24 could employ a locking clip 32.

Once embodiment 26 is securely attached to associated flange 28, component 20 can be placed at a selected location within computer housing 34. After its placement, component 20 may be secured in place by engaging with embodiment 26 a hole, similar to those indicated at 16, associated with EIA rail 12. As depicted in FIG. 2, EIA rail 12 may be secured within computer housing 34.

Figure 3A:
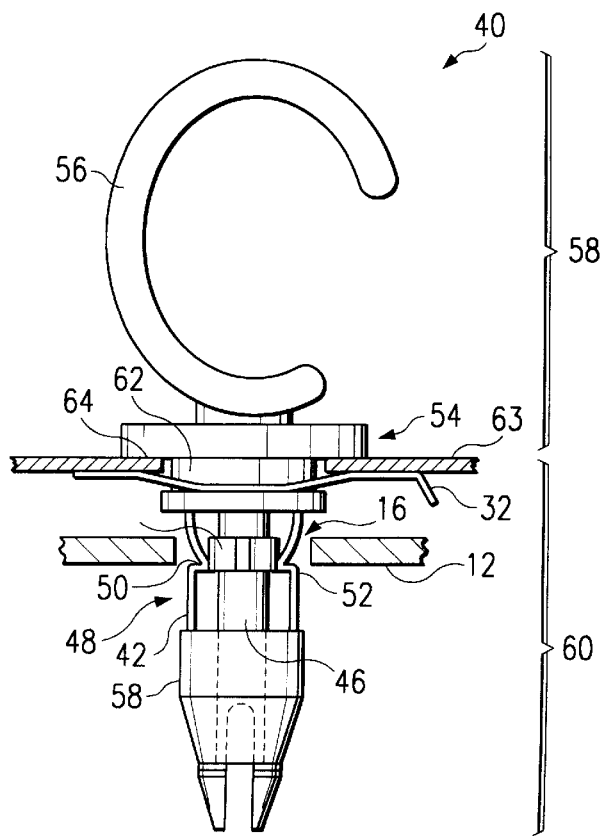
FIGS. 3A and 3B depict one embodiment of an apparatus incorporating teachings of the present invention in an actuated and unactuated state, the depicted embodiment includes a spring collet and a cam lobe for causing a portion of the spring collet to extend away from the shaft.
Figure 3B:
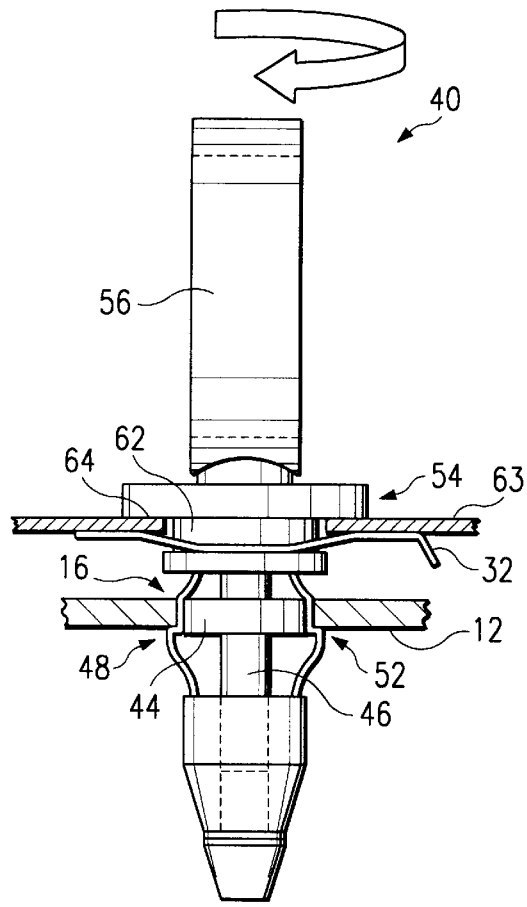

FIGS. 3A and 3B depict one embodiment 40 of an apparatus incorporating teachings of the present invention in an actuated and unactuated position. FIG. 3A depicts embodiment 40 in an unactuated position. Embodiment 40 includes a spring collet 42, which stretches between embodiment 40's casing 54 and collet housing 58. Collet housing 58 may also operate as an allignment guide. Embodiment 40 also includes a cam lobe 44 for causing a portion of spring collet 42 to extend away from a shaft 46. The portion of spring collet 42 that extends away includes a medial head 48 with a locking notch 50. Locking notch 50 includes a shoulder 52, which may operate to capture an element of a computer housing. In FIG. 3A, the engaged element includes hole 16 that extends through EIA rail 12.

Embodiment 40 also includes a casing 54 and a handle actuator 56. Casing 54 and handle actuator 56 at least partially compose the head end 58 of embodiment 40. Embodiment 40's tail end 60 is dimensioned such that it will fit through a face plate hole 62. Face plate hole 62 extends through an extended face plate 63 and provides an attachment point for embodiment 40. A portion of casing 54 is dimensioned such that it will not fit through face plate hole 62 and, as a result, creates an attachment shoulder 64. Attachment shoulder 64, in conjunction with locking clip 32, may operate to secure embodiment 40 to extended face plate 63.

FIG. 3B depicts embodiment 40 actuated and releasably secured to EIA rail 12. In the actuated position depicted in FIG. 3B, medial head 48 is extended away from shaft 46 by cam lobe 44. In this extended position, shoulder 52 captures EIA rail 12 and secures embodiment 40 in position.

Figure 4:
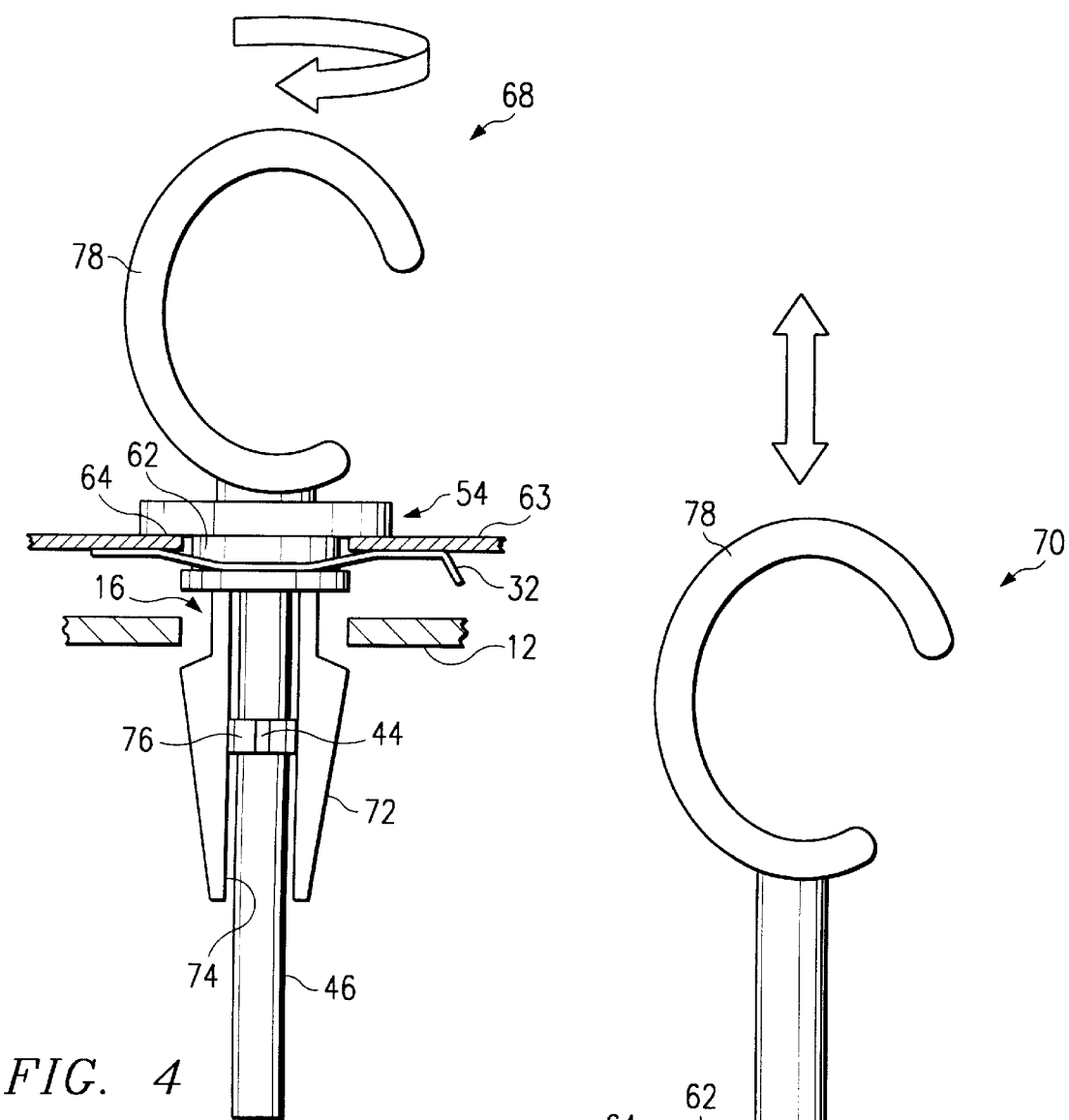
FIG. 4 depicts one embodiment of an apparatus incorporating teachings of the present invention including a projecting finger and a cam lobe for causing a portion of the projecting finger to extend away from the shaft.

FIG. 4 depicts an embodiment 68 of an apparatus incorporating teachings of the present invention wherein the invention includes a projecting finger 72 having a shaft side surface 74. In FIG. 4, a mechanical device including a shaft 46 and a cam 76 having at least one cam lobe 44 can operate to cause a portion of projecting finger 72 to extend away from shaft 46. Embodiment 68 also includes a casing 54 and a hand operated actuator 78, which may be coupled to shaft 46. Hand operated actuator 78 may include or potentially be replaced with a key actuator, an actuator that requires a key for actuation. In embodiment 68, shaft 46 may rotate relative to casing 54. When actuator 78 and, resultantly, shaft 46 are rotated, cam lobe 44 may be brought into contact with shaft side surface 74. Said contact causes projecting finger 72 to extend away from shaft 46.

Figure 5:
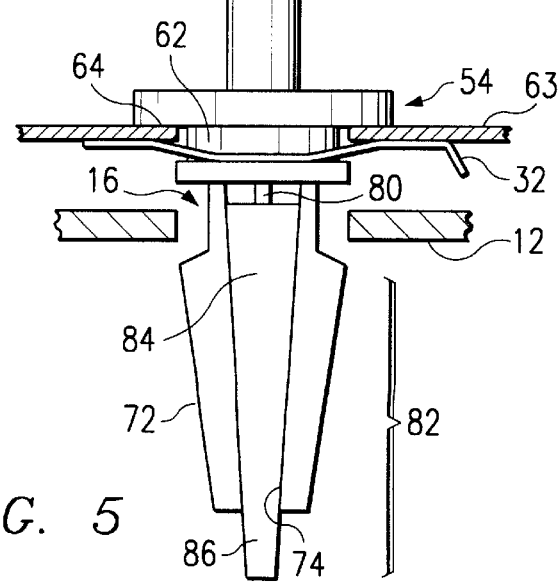
FIG. 5 depicts one embodiment of an apparatus incorporating teachings of the present invention including a projecting finger and a tapered shaft for causing a portion of the projecting finger to extend away from the shaft.

In FIG. 5, embodiment 70 incorporates teachings of the present invention and includes a mechanical device including a shaft 80 having a tapered end 82, which can operate to cause a portion of projecting finger 72 to extend away from shaft 80. Tapered end 82 includes sections with different cross sectional areas. For example, section 84 has a larger cross sectional area than section 86. Embodiment 70 also includes a casing 54 and a hand operated actuator 78, which is coupled to shaft 80. In embodiment 70, shaft 80 can move linearly relative to casing 54 in the axial direction defined by shaft 80. When moved in an actuating direction, a portion of shaft 80 with a large cross sectional area, for example portion 84, may be brought into contact with shaft side surface 74. Said contact causes projecting finger 72 to extend away from shaft 80.

Although the present invention has been described in detail, it should be understood that various changes, substitutions and alterations can be made thereto without departing from the sphere and scope of the invention as defined by the appended claims.

What is claimed is:

1. A releasable latching apparatus for securing a component of a computer system to a computer housing, comprising:

a casing;

a shaft integrated with the casing, the shaft operable to move relative to the casing;

an actuator coupled to the shaft;

a collet extending along the shaft, the collet comprising a locking portion operable to releasably secure the component to the computer housing by extending away from the shaft and capturing an element of the computer housing and the extending initiated from a medial portion of the collet; and a deflection device operable to extend the locking portion of the collet.

2. The apparatus of claim 1 wherein the collet comprises a spring finger, further wherein the locking portion is operable to extend away from the shaft through flexing of the spring finger.

3. The apparatus of claim 1 wherein the collet comprises a projecting finger with a shaft side surface, further wherein the shaft comprises a cam with a lobe, the lobe operable to contact the shaft side surface of the projecting finger and to extend the locking portion of the collet away from the shaft.

4. The apparatus of claim 1, wherein the actuator comprises a handle operable to indicate whether the collet is extended.

5. The apparatus of claim 1, wherein the collet comprises at least two collet fingers, each of the two collet fingers having a medial head.

6. The apparatus of claim 1, wherein the element of the computer housing comprises a rail with a hole there through, further wherein the collet comprises a ribbon-shaped spring finger with a locking notch, the locking notch operable to releasably capture an edge of the hole.

7. The apparatus of claim 1, wherein the shaft can rotate relative to the casing.

8. The apparatus of claim 7, further comprising a collet housing coupled to the shaft such that the shaft can rotate relative to the collet housing, the collet housing operable to support a portion of the collet.

9. A computer system, comprising:

a component chassis with a face plate;

a housing with a component chassis mounting device coupled thereto; and a releasable latching apparatus operable to releasably secure the component chassis to the component chassis mounting device, the releasable latching apparatus comprising:

a casing;

a shaft integrated with the casing, the shaft moveable relative to the casing;

an actuator coupled to the shaft; and a collet extending along the shaft, the collet operable to releasably secure the component to the computer housing by extending radially outward and capturing a portion of the component chassis mounting device, and the collet having a ribbon-shaped spring finger.

10. The system of claim 9, wherein the housing comprises an equipment rack operable to house rack mount computers.

11. The system of claim 9, wherein the actuator comprises a hand operated handle.

12. The system of claim 9, wherein the releasable latching apparatus is operable to couple to a flange associated with the face plate.

13. The system of claim 9, further comprising four releasable latching apparatus.

14. The system of claim 9, wherein the component chassis mounting device comprises an EIA rail.

15. A method for securing a component chassis to a computer housing, comprising the steps of:

coupling a releasable latching apparatus to a mounting plate associated with the component chassis, the latching apparatus comprising:

a casing;

a shaft integrated with the casing, the shaft moveable relative to the casing;

an actuator coupled to the shaft;

a collet extending along the shaft, the collet operable to releasably secure the component chassis to the computer housing by extending away from the shaft and capturing a receptacle affixed to the computer housing, the extending initiated from a medial portion of the collet;

a deflection device operable to extend the locking portion of the collet; and actuating the releasable latching apparatus to secure the component chassis to the computer housing.

16. The method of claim 15, wherein the receptacle affixed to the computer housing comprises an EIA rail affixed within the computer housing.

17. The method of claim 16, wherein the collet comprises a ribbon-shaped spring finger with a locking notch operable to releasably capture the EIA rail at a hole there through.

18. The method of claim 17, wherein the step of actuating the releasable latching apparatus further comprises the steps of:

placing a portion of the ribbon-shaped spring finger into the hole; and extending the locking notch with the deflection device associated with the shaft to capture an edge of the hole with the locking notch.

19. A method for releasably securing a component of a computer system within an opening in a housing, comprising:

attaching a releasable latching apparatus to a panel which forms a part of the component of the computer system;

placing the component of the computer system at a selected location within the opening of the housing such that a portion of the panel lies adjacent to a respective rail attached to the housing proximate the opening;

engaging a respective hole formed in the rail with a portion of the releasable latching apparatus; and actuating the releasable latching apparatus to expand a collet carried thereon such that the expanded collet captures the respective hole to releasably secure the component of the computer system at the selected location within the opening of the housing, and the collet having a ribbon-shaped spring finger with a locking notch.

20. The method of claim 19 wherein the releasable latching apparatus comprises a shaft, further wherein the step of actuating the releasable latching apparatus comprises:

rotating the shaft after engagement of the respective hole with the releasable latching apparatus; and expanding a portion of the collet radially outward from the shaft to capture the respective hole.

21. The method of claim 19 wherein the actuating step further comprises compressing at least two flexible springs, which define in part the collet, to expand a medial head of the flexible springs radially outward to releasably capture the respective hole.

22. The method of claim 19 wherein the panel comprises a flange associated with a face plate of the component.

23. The method of claim 19 wherein the collet comprises at least two collet fingers each having a medial head.

24. The method of claim 23, wherein the actuating step further comprises extending the at least two collet fingers radially outward to releasably capture the respective hole.

25. A releasable latching apparatus for securing a component of a computer system to a computer housing, comprising:

a casing;

a shaft integrated with the casing, the shaft operable to move relative to the casing;

an actuator coupled to the shaft;

a collet extending along the shaft, the collet comprising a locking portion operable to releasably secure the component to the computer housing by extending away from the shaft and capturing an element of the computer housing; and wherein the collet comprises a spring finger, further wherein the locking portion is operable to extend away from the shaft through flexing of the spring finger.

26. The apparatus of claim 25, wherein the actuator comprises a handle operable to indicate whether the collet is extended.

27. The apparatus of claim 25, wherein the collet comprises at least two collet fingers, each of the two collet fingers having a medial head.

28. The apparatus of claim 25, wherein the element of the computer housing comprises a rail with a hole there through, further wherein the collet comprises a ribbon-shaped spring finger with a locking notch, the locking notch operable to releasably capture an edge of the hole.

29. A releasable latching apparatus for securing a component of a computer system to a computer housing, comprising:

a casing;

a shaft integrated with the casing, the shaft operable to move relative to the casing;

an actuator coupled to the shaft;

a collet extending along the shaft, the collet comprising a locking portion operable to releasably secure the component to the computer housing by extending away from the shaft and capturing an element of the computer housing; and wherein the collet comprises a projecting finger with a shaft side surface, further wherein the shaft comprises a cam with a lobe, the lobe operable to contact the shaft side surface of the projecting finger and to extend the locking portion of the collet away from the shaft.

30. The apparatus of claim 29, wherein the collet comprises at least two collet fingers, each of the two collet fingers having a medial head.

31. The apparatus of claim 29, wherein the shaft can rotate relative to the ceasing.

32. The apparatus of claim 31, further comprising a collet housing coupled to the shaft such that the shaft can rotate relative to the collet housing, the collet housing operable to support a portion of the collet.

* * * * *